United States Patent
Clay

(10) Patent No.: US 9,538,633 B2
(45) Date of Patent: Jan. 3, 2017

(54) PASSIVE COOLING SYSTEM INTEGRATED INTO A PRINTED CIRCUIT BOARD FOR COOLING ELECTRONIC COMPONENTS

(71) Applicant: NVIDIA Corporation, Santa Clara, CA (US)

(72) Inventor: Richard Washburn Clay, Livermore, CA (US)

(73) Assignee: NVIDIA Corporation, Santa Clara, CA (US)

( * ) Notice: Subject to any disclaimer, the term of this patent is extended or adjusted under 35 U.S.C. 154(b) by 425 days.

(21) Appl. No.: 13/713,395

(22) Filed: Dec. 13, 2012

(65) Prior Publication Data

US 2014/0168903 A1 Jun. 19, 2014

(51) Int. Cl.
*H05K 7/20* (2006.01)
*H05K 1/02* (2006.01)

(52) U.S. Cl.
CPC .......... *H05K 1/0206* (2013.01); *H05K 1/0207* (2013.01); *H05K 1/0209* (2013.01); *H05K 7/205* (2013.01); *H01L 2224/16225* (2013.01); *H05K 2201/066* (2013.01); *H05K 2201/09609* (2013.01); *H05K 2201/10371* (2013.01); *H05K 2201/10734* (2013.01)

(58) Field of Classification Search
CPC ............................ H05K 1/0206; H05K 1/0207
USPC 361/704, 719, 720, 760–764; 174/252–265; 438/122
See application file for complete search history.

(56) References Cited

U.S. PATENT DOCUMENTS

| | | | | |
|---|---|---|---|---|
| 5,371,404 A * | 12/1994 | Juskey et al. | ................. | 257/659 |
| 5,721,454 A * | 2/1998 | Palmer | ................ | H01L 23/3677 |
| | | | | 257/700 |
| 6,335,862 B1 * | 1/2002 | Koya | .................. | H01L 23/3677 |
| | | | | 174/252 |
| 6,460,170 B1 * | 10/2002 | Shaeffer et al. | ............. | 716/137 |
| 6,477,054 B1 * | 11/2002 | Hagerup | ............ | H01L 23/3677 |
| | | | | 174/262 |
| 6,525,942 B2 * | 2/2003 | Huang et al. | ................. | 361/704 |
| 6,611,057 B2 * | 8/2003 | Mikubo | .................. | H01L 23/36 |
| | | | | 257/713 |
| 6,816,378 B1 * | 11/2004 | Belady | .................... | H01L 23/36 |
| | | | | 257/706 |
| 6,820,328 B2 * | 11/2004 | Barcley | ............... | H05K 1/0206 |
| | | | | 174/16.3 |
| 6,870,252 B2 * | 3/2005 | Novak | .................... | H01L 23/50 |
| | | | | 257/691 |
| 6,979,784 B1 * | 12/2005 | Duley | .................... | H05K 1/141 |
| | | | | 174/260 |
| 7,215,547 B2 * | 5/2007 | Chang | .................. | H05K 1/0272 |
| | | | | 165/104.33 |
| 7,269,017 B2 * | 9/2007 | Berlin | ................. | H01L 23/3677 |
| | | | | 165/185 |
| 7,284,389 B2 * | 10/2007 | Sharma | .............. | H01L 23/4735 |
| | | | | 257/E23.1 |

(Continued)

*Primary Examiner* — Courtney Smith
*Assistant Examiner* — Matt Dhillon
(74) *Attorney, Agent, or Firm* — Zilka-Kotab, PC

(57) ABSTRACT

A passive cooling system is provided for dissipating heat from an electronic component. The system includes a printed circuit board including a first dielectric layer and a first conductive layer, an electronic component coupled to the printed circuit board via a plurality of electrical contacts, and a cooling component thermally coupled to the electronic component through the first conductive layer by a micro via thermal array.

15 Claims, 5 Drawing Sheets

(56) References Cited

U.S. PATENT DOCUMENTS

| | | | | |
|---|---|---|---|---|
| 7,643,302 B2 * | 1/2010 | Tokunaga | H01L 23/3677 | 257/713 |
| 7,741,207 B2 * | 6/2010 | Hashimoto | H01L 24/03 | 257/E23.015 |
| 8,186,045 B2 * | 5/2012 | Sakamoto | H01L 21/4846 | 174/260 |
| 8,188,594 B2 * | 5/2012 | Ganesan | H01L 23/367 | 257/675 |
| 8,279,605 B2 * | 10/2012 | Kawanami | H01L 23/642 | 361/704 |
| 8,411,444 B2 * | 4/2013 | Gaynes | H05K 1/0206 | 174/252 |
| 8,453,323 B2 * | 6/2013 | Sakamoto | H01L 21/4846 | 174/260 |
| 8,462,511 B2 * | 6/2013 | Lee | H01L 23/3677 | 257/686 |
| 8,570,745 B2 * | 10/2013 | Ju | H01L 23/36 | 165/104.33 |
| 8,866,376 B2 * | 10/2014 | Lee | H01L 33/60 | 313/502 |
| 2002/0034066 A1 * | 3/2002 | Huang | H01L 23/3677 | 361/704 |
| 2005/0093120 A1 * | 5/2005 | Millik et al. | | 257/678 |
| 2006/0023439 A1 * | 2/2006 | Fraley | H01L 23/49822 | 361/780 |
| 2007/0074389 A1 * | 4/2007 | Searls et al. | | 29/832 |
| 2009/0279255 A1 * | 11/2009 | Sauciuc | H05K 7/20163 | 361/697 |
| 2011/0134610 A1 * | 6/2011 | Baur | H01L 23/473 | 361/720 |
| 2012/0236568 A1 * | 9/2012 | Lee et al. | | 362/294 |
| 2013/0154108 A1 * | 6/2013 | Lin et al. | | 257/774 |

* cited by examiner

PASSIVE COOLING SYSTEM INTEGRATED INTO A PRINTED CIRCUIT BOARD FOR COOLING ELECTRONIC COMPONENTS

FIELD OF THE INVENTION

The present invention relates to electronic systems, and more particularly to cooling solutions for electronic systems.

BACKGROUND

High power electronic components such as central processing units and graphics processing units generate a large amount of heat during operation. The heat needs to be dissipated to avoid overheating the component. Conventional cooling solutions include placing a heat sink or heat pipe in contact with a surface of the component, which draws heat away from the electronic component via conduction. The heat is then dissipated by convection, possibly in conjunction with one or more fans that force air over the heat sink or heat pipe. Efficient cooling solutions enable electronic components to operate at higher speeds, thereby making the overall system more efficient.

Current designs for heat sinks and heat pipes are limited in that these devices only draw heat away from a top surface of the electronic component. For example, the heat is transferred to the heat sink through conduction at the contact surface between the heat sink and the component. Increasing the size (i.e., volume) of the heat sink is not effective after a certain point because the additional material added to the heat sink is further and further away from the contact surface. The steady state conductive properties of the heat sink material limit the ability of the heat sink to draw any additional heat away from the component. Thus, there is a need for addressing this issue and/or other issues associated with the prior art.

SUMMARY

A passive cooling system is provided for dissipating heat from an electronic component. The system includes a printed circuit board including a first dielectric layer and a first conductive layer, an electronic component coupled to the printed circuit board via a plurality of electrical contacts, and a cooling component thermally coupled to the electronic component through the first conductive layer by a micro via thermal array.

DETAILED DESCRIPTION

Figure 1A:
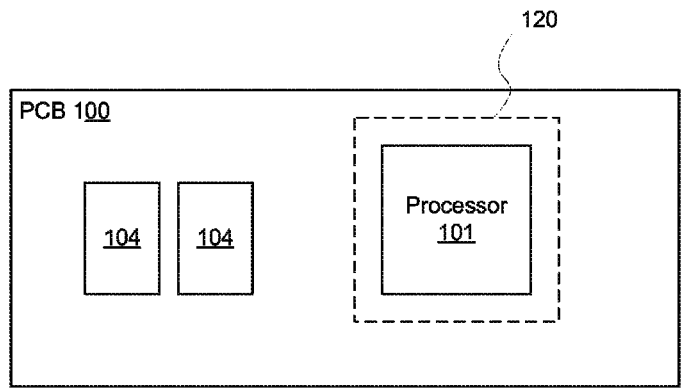
FIGS. 1A & 1B illustrate a printed circuit board including one or more electronic components, in accordance with one embodiment.
Figure 1B:
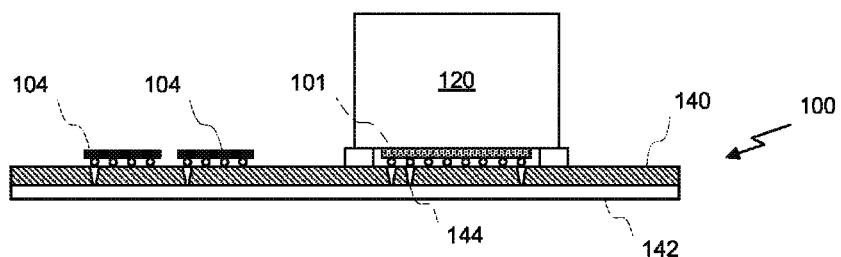

FIGS. 1A & 1B illustrate a printed circuit board (PCB) 100 including one or more electronic components, in accordance with one embodiment. As shown in FIG. 1A, the PCB 100 includes one or more electronic components coupled thereto, such as processor 101. In the context of the present description, an electronic component may include a central processing unit, a graphics processing unit, a System-on-chip (SoC), an application specific integrated circuit (ASIC), memory, memory array, or some other type of high power device. It should be noted that, while various optional features are set forth herein in connection with the PCB 100, such features are set forth for illustrative purposes only and should not be construed as limiting in any manner.

For example, in the context of the exemplary embodiment illustrated in FIG. 1A, the PCB 100 may or may not include two memory modules 104 coupled to the processor 101. It will be appreciated that the electronic components included on the PCB 100 are optional and other components may be included in addition to or in lieu of the components shown in FIG. 1A. For example, the PCB 100 may include a voltage regulator, a co-processor, additional memory modules, capacitors, resistors, and an interface such as a JTAG (Joint Test Action Group) interface, a USB (Universal Serial Bus) interface, or a PCIe (Peripheral Component Interconnect Express) interface.

In order to dissipate heat from the processor 101 or other high-power device, a heat sink 120 is placed on top of the processor 101. The heat sink 120 is made of aluminum, copper, or other material with good thermal transfer properties. The heat sink 120 may include fins or other structures that increase the surface area of the heat sink 120 to allow for better thermal transfer due to convection. The heat sink 120 may include an integrated fan assembly (not shown) that increases the air flow over the surface of the heat sink 120.

As shown in FIG. 1B, The PCB 100 includes a first layer 140 of dielectric material such as FR-4 (woven glass fiber and epoxy resin) and a second layer 142 of conductive material such as copper. The second layer 142 may be electronically coupled to a ground reference of the voltage supply and act as aground plane for the PCB 100. The second layer 142 is electronically connected to a top surface of the first layer 140 through a plurality of micro vias 144. As is known in the art, vias are holes drilled through a printed circuit board that are then filled or coated (e.g., via electroplating) with a conductive material such as copper or solder to create an electrical pathway between a pad located on a top surface of the PCB layer and a pad located on the bottom surface of the PCB layer. Micro vias 144 are similar to vias, but micro vias 144 are typically smaller in diameter; e.g., a few tens of μm in diameter (0.100 mm-0.040 mm). In one embodiment, micro vias 144 are typically drilled using a computer-controlled laser such that hundreds or thousands of micro vias 144 may be drilled in a PCB with high accuracy in a small amount of time. Micro vias 144 are implemented in HDI (High Density Interconnect) PCBs and may be manufactured as stacked micro vias (i.e., a copper filled hole through all layers of the PCB), blind micro vias (i.e., a hole through one or more layers of the PCB but not through all layers of the PCB), and buried micro vias (i.e., a hole through an intermediate layer of the PCB but not through the top layer or the bottom layer of the PCB).

In one embodiment, the processor 101 is connected to the second layer 142 of the PCB 100 via a ball-grid-array (BGA). In addition, the memory modules 104 are also connected to the second layer 142 of the PCB 100 via a BGA. Although the connections shown in FIG. 1B are implemented as BGA packages, it will be appreciated that the electrical components connected to the PCB 100 may be connected using other technologies such as through-hole technology, dual-in-line packages (e.g., Small-Outline Integrated Circuits or SOIC; Thin Small-Outline Package or TSOP; etc.), quad-in-line packages (e.g., Low-profile Quad Flat Package or LQFP; Plastic Leaded Chip Carrier or PLCC; etc.), and grid arrays (e.g., Pin Grid Array or PGA; Fine-pitch Ball Grid Array or FBGA; etc.), among other package types. In one embodiment, the electrical connections between the BGA of the processor 101 and the second layer 142 of the PCB 100 is made using via-in-pad (VIP) technology, which makes the electrical connection using a micro via 144 that resides in the same location as the solder pad to which the ball is soldered. In other words, the micro vias 144 are drilled in locations corresponding to the locations of the balls in the ball grid array. Then, the micro vias 144 are electro plated with copper such that the micro vias 144 are completely filled and only a copper pad remains on the surface of the PCB 100.

Figure 2A:
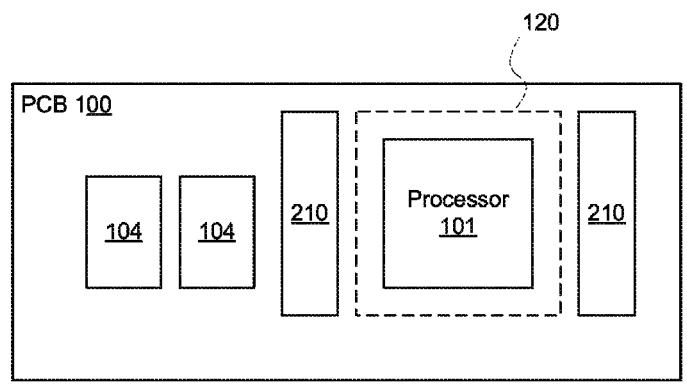
FIGS. 2A & 2B illustrate the printed circuit board of FIGS. 1A & 1B with additional cooling components integrated thereon, in accordance with one embodiment.
Figure 2B:
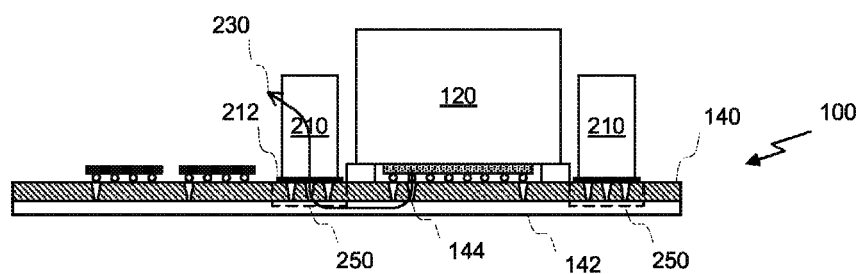

FIGS. 2A & 2B illustrate the printed circuit board 100 of FIGS. 1A & 1B with one or more cooling components 210 integrated thereon, in accordance with one embodiment. In one embodiment, the cooling components 210 are dedicated convective or conductive thermal structures that provide additional cooling capacity for processor 101. In one embodiment, the cooling components 210 are constructed from a metallic material that has good thermal transfer properties. The cooling components 210 may have structures formed therein that increase the cooling efficiency of the cooling components 210, such as fins or other structures that increase the surface area of the cooling components 210. The cooling components 210 do not directly contact a surface of the processor 101 but instead are thermally coupled to the processor 101 via the second layer 142 of the PCB 100.

As shown in FIG. 2B, the cooling components 210 are coupled to the second layer 142 of the PCB 100 with micro vias. The cooling components 210 may be placed on the same side of the PCB 100 as the processor 101. In one embodiment, the cooling component 210 is coupled to the second layer 142 of the PCB 100 with a micro via thermal array 250 that, when filled during electroplating, form a surface pad 212 on the surface of the PCB 100. A micro via thermal array 250 is an array of tightly packed micro vias (e.g., every 200 μm) arranged in a two-dimensional grid pattern. The use of the micro via thermal array 250 provides a high ratio of copper to dielectric in the area under the surface pad 212. The higher ratio of copper to dielectric provides better thermal conductivity for heat to transfer from the second layer 142 of the PCB 100 to the cooling component 210. The vias of the micro via thermal array 250 may be plated in copper or copper alloys, as well as other materials typically used in electroplating of PCBs. In one embodiment, the micro via thermal array 250 is one dimensional and contains a single row of micro vias. In another embodiment, the micro via thermal array contains as few as a single via. It will be appreciated that the density of micro vias in the area of the micro via thermal array 250 affects the heat transfer efficiency between the cooling components 210 and the second layer 142 of the PCB 100.

Heat from the processor 101 is transferred through a top surface of the processor 101 to the heat sink 120. In addition, heat from the processor 101 is also transferred through the bottom surface of the processor 101 to the second layer 142 of the PCB 100 through one or more micro vias 144 that are thermally coupled to the bottom surface of the processor 101 through the BGA. Heat conducts laterally through the second layer 142 of the PCB 100 to the micro via thermal arrays 250 coupled to the cooling components 210. The heat is transferred from the second layer 142 of the PCB 100 into the cooling component 210, where the heat is dissipated via convection. The heat flow path 230 is shown in FIG. 2B. Although only one path is shown, other paths may also exist such as between processor 101 and the second cooling component 210 on the right side of the processor 101.

In one embodiment, the cooling components 210 are EMI (electromagnetic interference) shielding structures. For example, the cooling components 210 may be EMI shielding gaskets made of a Beryllium Copper sheet metal having a cross sectional shape such as a rectangle, or other alternate form for greater surface area. Alternatively, the cooling components 210 may be EMI cages that are placed over other components such as low power integrated circuits. In yet other embodiments, the cooling components 210 may be additional heat sinks with or without integrated fan assemblies that force air over the additional heat sinks. Although shown in FIGS. 2A & 2B as two separate components located on two sides of the processor 101, in one embodiment, cooling component 210 is a rectangular shaped EMI shield that completely surrounds the processor 101. It will be appreciated that the PCB 100 may include one or more cooling components 210.

Figure 3:
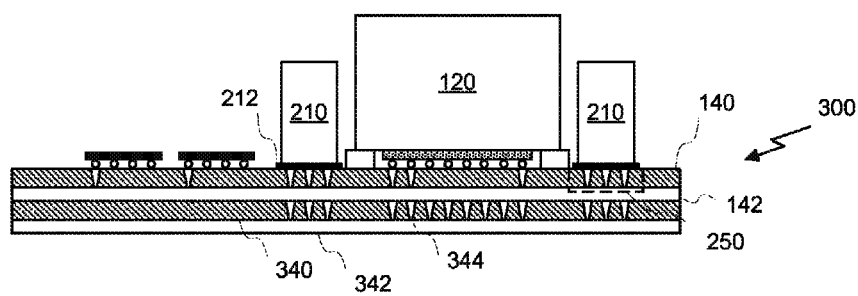
FIG. 3 illustrates a printed circuit board with multiple thermal flow paths between a processor and the cooling components integrated within multiple layers of the printed circuit board, in accordance with one embodiment.

FIG. 3 illustrates a printed circuit board 300 with multiple thermal flow paths between a processor 101 and the cooling components 210 integrated within multiple layers of the printed circuit board, in accordance with one embodiment. As shown in FIG. 3, the PCB 300 includes a first layer 140 of dielectric material and a second layer 142 of conductive material similar to the PCB 100 of FIGS. 1A & 1B. The PCB 300 also includes a third layer 340 of dielectric material and a fourth layer 342 of conductive material. The second layer 142 and the fourth layer 342 are electrically and thermally coupled via additional micro vias 344 in the third layer 340 of the PCB 300. The micro vias 344 may be buried, copper filled micro vias formed in the third layer 340. Alternatively, the micro vias 344 and micro vias 144 may be formed by drilling one blind hole in the fully formed and laminated PCB 300. It will be appreciated that, in some embodiments, through micro vias may also be implemented as micro vias 344.

In one embodiment, the second layer 142 and the third layer 342 of the PCB 300 are electrically coupled to a reference voltage of the power supply and form a multi-layer ground plane. By forming a multi-layer ground plane, thermal energy has multiple flow paths laterally through the PCB 300. A first flow path allows heat to move from the processor 101 to the second layer 142 of the PCB 300 and up into the cooling components 210. In addition, a second flow path allows heat to move from the processor 101 to the fourth layer 342 of the PCB 300 and up into the cooling components 210. Thermal energy flows from the second layer 142 of the PCB 300 to the fourth layer 342 of the PCB 300 via the micro vias 344. It will be appreciated, that the additional layer of conductive material in the PCB 300 enables more heat to be transferred to the cooling components in a lateral direction due to the increased cross sectional area of the combination of the second layer 142 and the fourth layer 342.

In other embodiments, more than two layers of conductive material may be included in the PCB 300. For example, PCB 300 may include a fifth layer of dielectric below the fourth layer 342 of the PCB 300 and a sixth layer of conductive material below the fifth layer of the PCB 300. Additional pairs of dielectric layers and conductive layers may be included to provide additional heat transfer capacity. It will be appreciated, that the thickness of the layers of the conductive material may also be increased (e.g., by lengthening the time of the electroplating process) in order to increase the heat transfer capacity of individual layers.

Figure 4A:
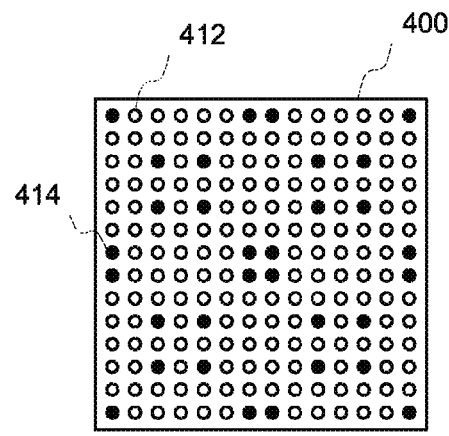
FIGS. 4A & 4B illustrate the electrical connections of a processor, in accordance with one embodiment.
Figure 4B:
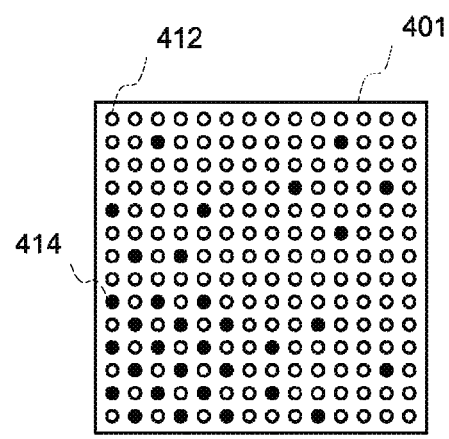

FIGS. 4A & 4B illustrate the electrical connections of a processor 400, in accordance with one embodiment. As shown in FIG. 4A, the processor 400 is integrated within a ball grid array package having a plurality of balls 412 on the bottom surface of the package and electrically coupled to the integrated circuit of the processor 400. The balls 412 may be soldered to surface pads on the top surface of the PCB 100. A portion of the plurality of balls 412 are coupled to a reference voltage (i.e., GND) of a voltage supply used to power the processor 400. The balls in the portion 414, shown as black in FIG. 4A, are arranged in a manner that enables efficient thermal transfer from the bottom surface of the processor 400 to the second layer 142 of the PCB 100. Given a uniform thermal profile of processor 400 (i.e., the heat generated on the surface of the processor during operation is uniform throughout the surface of the processor), the location of balls 414 are evenly distributed across the surface of the processor 400 such that thermal energy transfer from the processor 400 to the second layer 142 of the PCB 100 is efficient.

In another embodiment, as shown in FIG. 4B, the thermal profile of a different processor 401 may be non-uniform. In other words, the processor 401 may generate more heat at one location on the surface of the package than at another location within the package. When the thermal profile of the processor 401 is non-uniform, the balls in the portion 414, shown as black in FIG. 4B, may be arranged such that the density of balls 414 is higher closer to locations that generate more heat. For example, as shown in FIG. 4B, the lower left quadrant of the processor 401 may generate more heat than the other three quadrants of the processor 401. In order to more efficiently transfer thermal energy from the bottom surface of the processor 401 to the second layer 142 of the PCB 100, the density of balls 414 is increased in the lower left quadrant of processor 401. When compared to the arrangement of balls 414 of processor 400 illustrated in FIG. 4A, each processor includes 32 balls electrically coupled to the reference voltage. However, the lower quadrant of processor 401 includes 18 of the 32 balls 414 coupled to the reference voltage. In comparison, each of the quadrants of processor 400 includes 8 of the 32 balls 414 coupled to the reference voltage.

Figure 5:
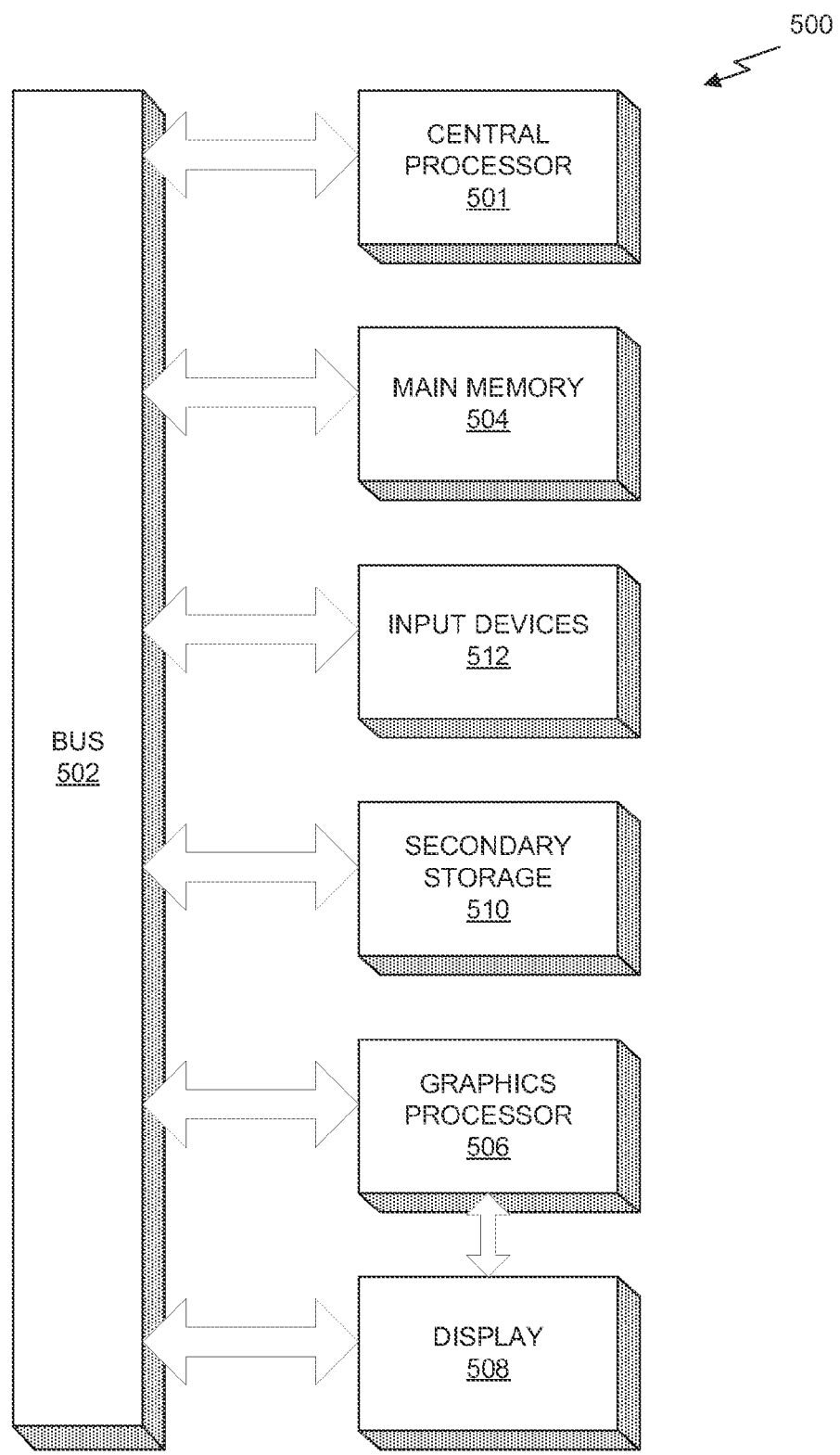
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. As shown, a system 500 is provided including at least one central processor 501 that is connected to a communication bus 502. The communication bus 502 may be implemented using any suitable protocol, such as PCI (Peripheral Component Interconnect), PCI-Express, AGP (Accelerated Graphics Port), HyperTransport, or any other bus or point-to-point communication protocol(s). The system 500 also includes a main memory 504. Control logic (software) and data are stored in the main memory 504 which may take the form of random access memory (RAM).

The system 500 also includes input devices 512, a graphics processor 506, and a display 508, i.e. a conventional CRT (cathode ray tube), LCD (liquid crystal display), LED (light emitting diode), plasma display or the like. User input may be received from the input devices 512, e.g., keyboard, mouse, touchpad, microphone, and the like. In one embodiment, the graphics processor 506 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 500 may also include a secondary storage 510. The secondary storage 510 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 504 and/or the secondary storage 510. Such computer programs, when executed, enable the system 500 to perform various functions. The memory 504, the storage 510, and/or any other storage are possible examples of computer-readable media.

In one embodiment, the architecture and/or functionality of the various previous figures may be implemented in the context of the central processor 501, the graphics processor 506, an integrated circuit (not shown) that is capable of at least a portion of the capabilities of both the central processor 501 and the graphics processor 506, a chipset (i.e., a group of integrated circuits designed to work and sold as a unit for performing related functions, etc.), and/or any other integrated circuit for that matter. For example, a PCB may be manufactured that includes the central processor 501 or the graphics processor 506 thermally coupled to cooling components 210.

Still yet, the architecture and/or functionality of the various previous figures may be implemented in the context of a general computer system, a circuit board system, a game console system dedicated for entertainment purposes, an application-specific system, and/or any other desired system. For example, the system 500 may take the form of a desktop computer, laptop computer, server, workstation, game consoles, embedded system, and/or any other type of logic. Still yet, the system 500 may take the form of various other devices including, but not limited to a personal digital assistant (PDA) device, a mobile phone device, a television, etc.

Further, while not shown, the system 500 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system comprising: a printed circuit board including a first dielectric layer and a first conductive layer; an electronic component coupled to the printed circuit board via a plurality of electrical contacts that electronically and thermally couple the electronic component to the first conductive layer; a cooling component coupled to the printed circuit board via a micro via thermal array; wherein the micro via thermal array comprises a two-dimensional array of vias, each via having a diameter equal to or less than one hundred micrometers; and a heat sink in contact with a top surface of the electronic component, wherein the cooling component comprises a dedicated convective or conductive thermal structure that is separate and distinct from the heat sink in contact with the top surface of the electronic component, the cooling component is thermally coupled to the electronic component through the first conductive layer by the micro via thermal array, and the cooling component does not directly contact a surface of the electronic component; wherein the first conductive layer comprises a ground plane of the printed circuit board that is electrically coupled to a reference voltage of a voltage supply.

2. The system of claim 1, wherein the cooling component comprises an electro-magnetic interference (EI) shield gasket.

3. The system of claim 1, wherein the printed circuit board further comprises a second dielectric layer and a second conductive layer.

4. The system of claim 3, wherein the first conductive layer is electrically and thermally coupled to the second conductive layer through a plurality of additional micro vias.

5. The system of claim 4, wherein the plurality of additional micro vias are buried micro vias.

6. The system of claim 1, wherein the cooling component comprises an additional heat sink having a plurality of fins formed thereon.

7. The system of claim 6, further comprising a fan configured to force air across the fins formed in the additional heat sink.

8. The system of claim 1, wherein each via in the micro via thermal array is drilled with a laser and at least partially filled with a conductive material using an electroplating process.

9. The system of claim 8, wherein the conductive material is at least one of copper or a copper alloy.

10. The system of claim 1, wherein the cooling component is soldered to a surface pad that is formed on top of the micro via thermal array.

11. The system of claim 1, wherein a portion of the plurality of electrical contacts are connected to the first conductive layer, and wherein an arrangement of the portion is selected based on a heat generation profile of the electronic component.

12. A printed circuit board, comprising: a first dielectric layer including a micro via thermal array; and a first conductive layer coupled to a surface pad on a top surface of the first dielectric layer via the micro via thermal array; wherein the first conductive layer comprises a ground plane of the printed circuit board that is electrically coupled to a reference voltage of a voltage supply; wherein the surface pad is soldered to a cooling component coupled to the printed circuit board via the micro via thermal array, wherein the cooling component is thermally coupled to an electronic component through the first conductive layer by the micro via thermal array, wherein the micro via thermal array comprises a two-dimensional array of vias, each via having a diameter equal to or less than one hundred micrometers; wherein a top surface of the electronic component is in contact with a heat sink, and wherein the cooling component comprises a dedicated convective or conductive thermal structure that is separate and distinct from the heat sink in contact with the top surface of the electronic component and the cooling component does not directly contact a surface of the electronic component.

13. The printed circuit board of claim 12, wherein the cooling component comprises an electro-magnetic interference (EMI) shield gasket.

14. The printed circuit board of claim 12, wherein the first conductive layer comprises a ground plane of the printed circuit board that is electrically coupled to a reference voltage of a voltage supply.

15. The printed circuit board of claim 12, further comprising: a second dielectric layer; and a second conductive layer, wherein the first conductive layer is electrically and thermally coupled to the second conductive layer through a plurality of additional micro vias.

* * * * *

UNITED STATES PATENT AND TRADEMARK OFFICE
CERTIFICATE OF CORRECTION

PATENT NO. : 9,538,633 B2  
APPLICATION NO. : 13/713395  
DATED : January 3, 2017  
INVENTOR(S) : Richard Washburn Clay Page 1 of 1

It is certified that error appears in the above-identified patent and that said Letters Patent is hereby corrected as shown below:

In the Specification

Column 2, Line 38 please replace "as aground plane" with --as a ground plane--.

In the Claims

Column 7, Line 20 please replace "(EI) shield" with --(EMI) shield--.

Signed and Sealed this  
Thirty-first Day of March, 2020

Andrei Iancu  
*Director of the United States Patent and Trademark Office*